United States Patent [19] | [11] 4,079,322
Lawrence et al. | [45] Mar. 14, 1978

[54] AUTOMATIC VEHICLE MONITORING SYSTEM

[75] Inventors: Willis Thompson Lawrence, Winchester; David B. Spaulding, Carlisle, both of Mass.

[73] Assignee: Novatek, Inc., Burlington, Mass.

[21] Appl. No.: 660,892

[22] Filed: Feb. 24, 1976

Related U.S. Application Data

[63] Continuation of Ser. No. 462,138, April 18, 1974, abandoned.

[51] Int. Cl.[2] .................. H03K 5/00

[52] U.S. Cl. .................. 328/5; 307/309; 307/264; 328/167

[58] Field of Search .................. 307/308, 309, 264, 230; 328/1, 5, 167; 324/37; 340/32

[56] References Cited

U.S. PATENT DOCUMENTS

| | | | |
|---|---|---|---|
| 2,882,488 | 4/1959 | Price et al. | 324/37 |
| 3,493,923 | 2/1970 | Stevens et al. | 340/32 |
| 3,835,374 | 9/1974 | Frost | 324/37 |

*Primary Examiner*—John Zazworsky
*Attorney, Agent, or Firm*—Richard J. Birch

[57] ABSTRACT

An automatic vehicle monitoring system utilizing a plurality of spaced magnetic fields disposed along a vehicle path. A vehicle mounted sensor produces electrical signals in response to the presence of the magnetic fields. These signals are processed to discriminate against noise and to extract therefrom information concerning the location of the vehicle.

6 Claims, 20 Drawing Figures

FIG. 2

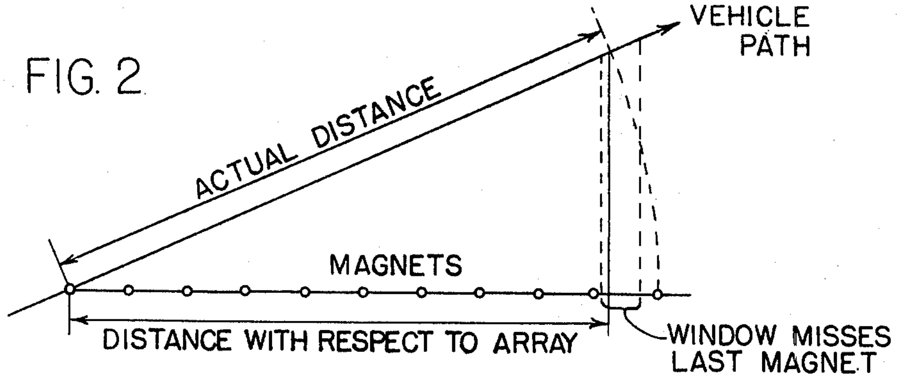

DISPLACEMENT OF WINDOW WITH ANGLE

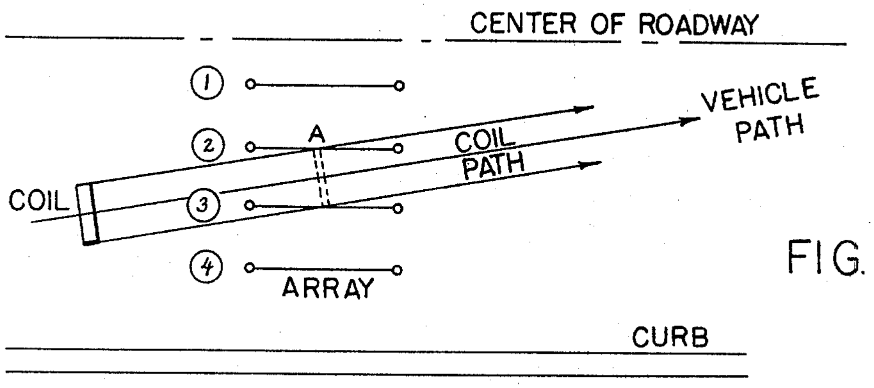

FIG. 3

OVERLAP OF SIGNALS WITH PARALLEL ARRAYS

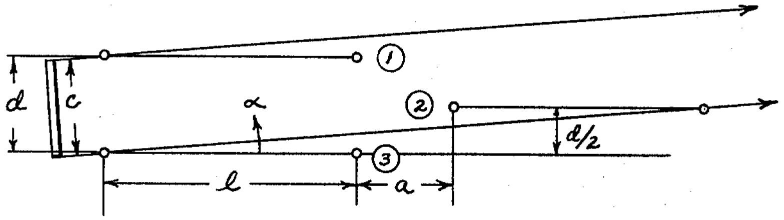

FIG. 4

$c$ = COIL WIDTH
$d/2$ = ARRAY SPACING LATERAL
$a$ = ARRAY SPACING LONGITUDINAL
$\alpha$ = ANGLE BETWEEN VEHICLE PATH AND ARRAY AXIS
$m$ = MAGNET SPACING $$a = \frac{l}{\cos\alpha} - m \qquad \sin\alpha = \frac{c - \frac{d}{2\cos\alpha}}{2l + \frac{l}{\cos\alpha} - m - \frac{d}{2}\tan\alpha}$$

VARIABLES RELATED TO OFFSET ARRAY LAYOUT

ARRAY CONFIGURATION WHICH MINIMIZES MAGNET USAGE

ARRAY LOCATIONS AT ZONE BOUNDARIES

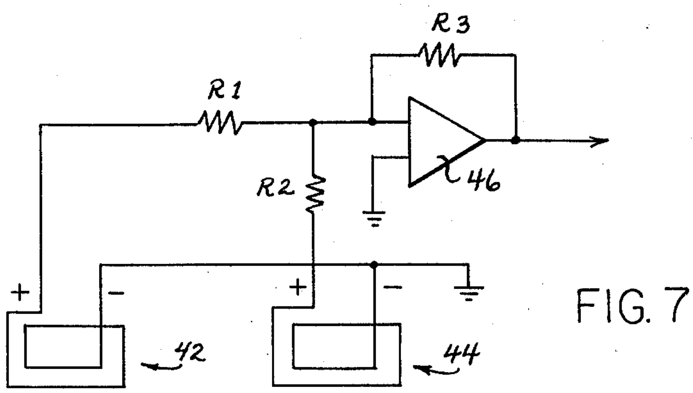
FIG. 7
FIG. 8
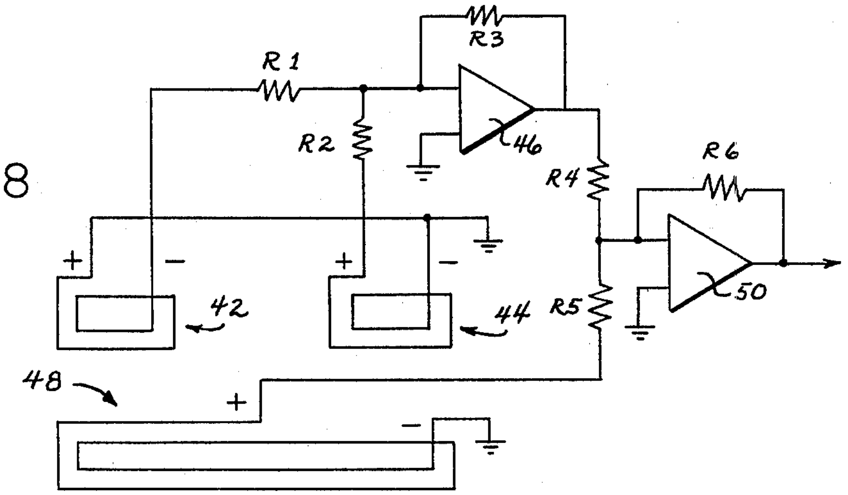

AUTOMATIC VEHICLE MONITORING SYSTEM

This is a continuation, of application Ser. No. 462,138, filed Apr. 18, 1974 and now abandoned.

BACKGROUND OF THE INVENTION

The present invention relates to vehicle monitoring systems in general and, more particularly to an automatic vehicle monitoring system which utilizes a plurality of spaced magnetic fields positioned along a vehicle path to provide information concerning the vehicle.

Vehicle location, guidance and control systems which employ spaced magnets along the vehicle path are known in the art. Representative examples are described in U.S. Pat. Nos. 2,493,755, 3,085,646; 3,493,923; 3,609,678; and, 3,668,624. See also "DAIR - A New Concept In Highway Communications For Added Safety and Driving Convenience" by E. A. Hanysz et al, *IEEE Transactions On Vehicle Technology,* Vol. VT-16, No. 1, October 1967.

The practical implementation of the prior art magnetic coding vehicle monitoring systems presents a number of problems in terms of sensor sensitivity, noise discrimination and magnetic array configurations.

It is a general object of the invention to provide a practical automatic vehicle monitoring system which utilizes a plurality of spaced magnetic fields disposed along a vehicle path.

It is a specific object of the invention to provide a magnetic array configuration and coding which provides noise discrimination and optimum utilization of a given number of magnets.

It is another object of the invention to provide a magnetic field pickup coil construction which has sufficient sensitivity with a concomitant physical configuration that permits under vehicle mounting.

It is still another object of the invention to provide noise discrimination circuits which substantially eliminate the deleterious effects of magnetic noise.

These objects and other objects and features of the invention will best be understood from a detailed description of a preferred embodiment thereof selected for purposes of illustration and shown in the accompanying drawings in which:

FIG. 2 is a diagram of a magnetic array configuration illustrating the displacement of the distance "window";

FIG. 3 is a diagram of the configuration of a plurality of magnetic arrays illustrating signal overlap with parallel arrays;

FIG. 4 is a magnetic array diagram depicting the variables that are related to offset array layouts;

FIG. 7 is a partial schematic and block diagram of the summing circuit for split pickup coils;

FIG. 8 is a similar diagram to that of FIG. 7 showing the addition of a third coil;

Figure 1:
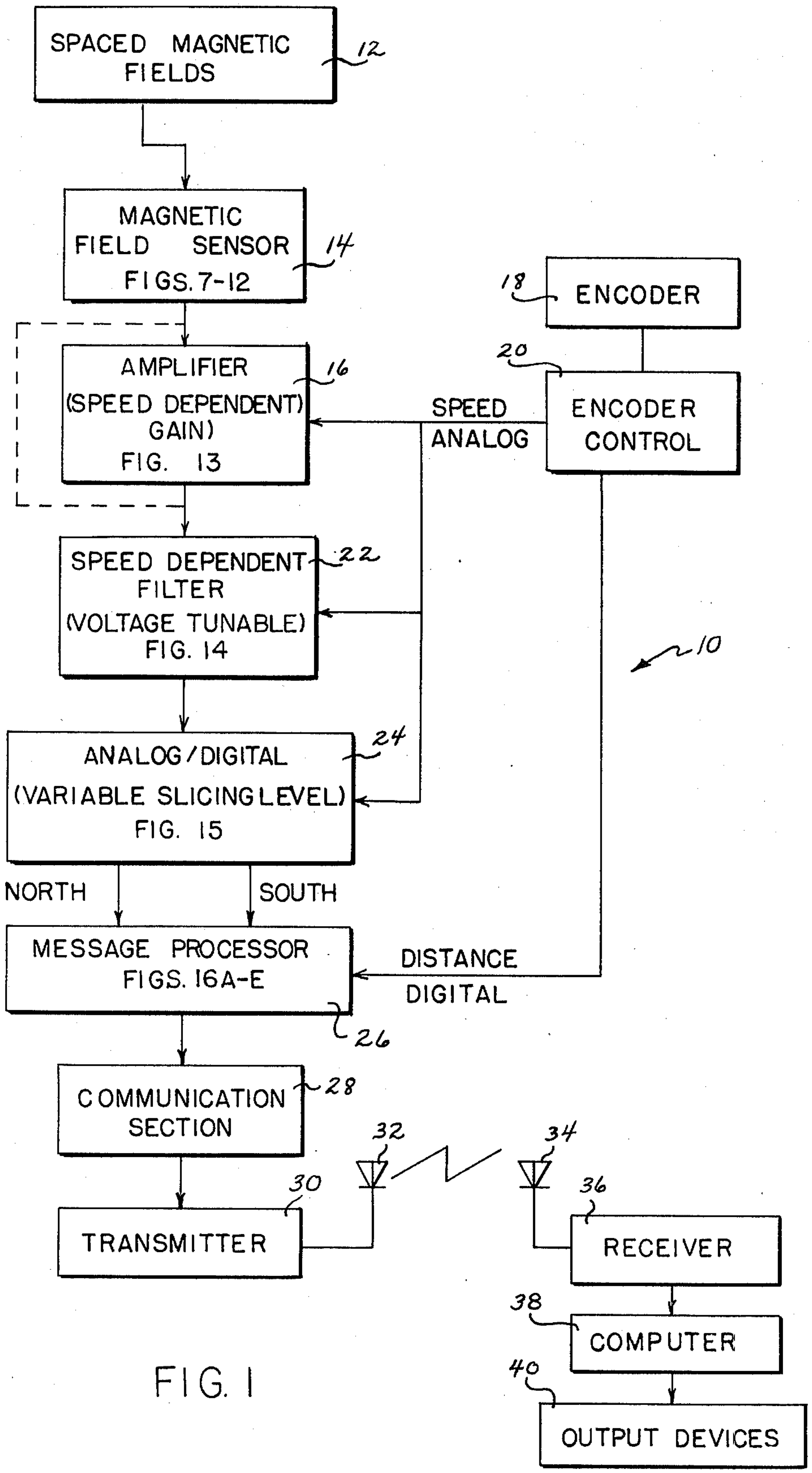
FIG. 1 is a block diagram of an automatic vehicle monitoring system incorporating the present invention.

Turning now to the drawings and particularly to FIG. 1 thereof, there is shown in block diagram form an automatic vehicle monitoring system, indicated generally by the reference numeral 10, which incorporates the subject matter of the present invention. The automatic vehicle monitoring system utilizes a plurality of coded, spaced magnetic fields 12 such as a plurality of permanent magnets which are imbedded in a roadway to provide information to a vehicle which moves with respect to the spaced magnetic fields. The configurations of the magnetic array will be discussed below in connection with FIGS. 2–6. For purposes of this application, the term "vehicle" should be broadly construed and not limited to wheeled vehicles.

A vehicle mounted magnetic field sensor 14, such as a Hall effect device or a pick-up coil, generates an electrical signal in response to the presence of a magnetic field. The specific construction of the magnetic field sensor 14 will be described in detail in connection with the discussion of FIGS. 7–12.

The electrical signal output from the magnetic field sensor 14 is applied to a variable gain amplifier 16. The amplifier is dependent upon the speed of the vehicle. The vehicular speed is obtained from a speed encoder 18 such as, a shaft encoder which is coupled to the speedometer drive. The encoder is controlled by an encoder control 20 which produces an analogue "speed" signal and a digital "distance" signal. The analogue speed signal is used to vary the gain of amplifier 16. The specific details of amplifier 16 will be discussed below in connection with FIG. 13.

The output from amplifier 16 is applied to a speed dependent filter 22 which is voltage tuned in response to the analogue speed signal from encoder 20 to vary the pass band of the filter. It should be noted that the variable gain amplifier 16 can be by-passed in the signal processing chain as indicated by the dashed lines in FIG. 1. In this case, the electrical signal output from the magnetic field sensor 14 is applied directly to the speed dependent filter 22.

Figure 15:
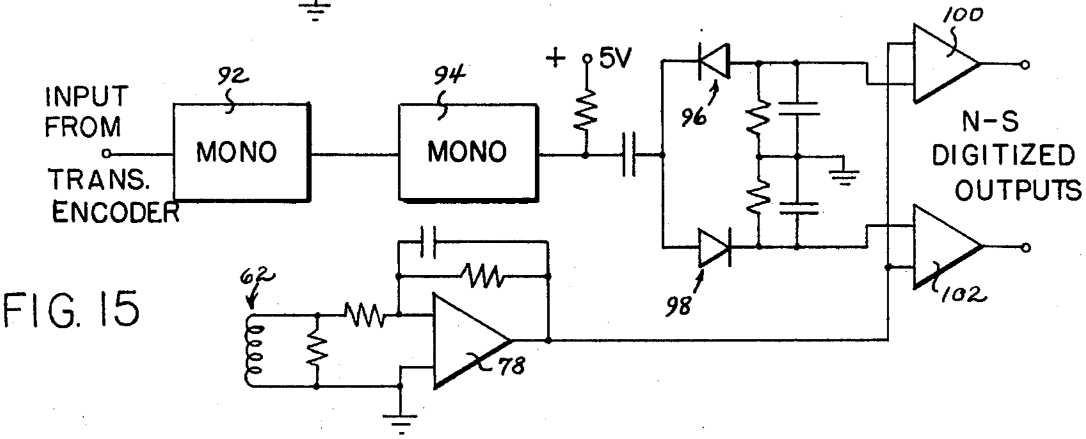
FIG. 15 is a partial schematic and block diagram of an A/D convertor having a variable slicing level.

The output from speed dependent filter 22 is applied to an analog-to-digital converter 24 which includes a speed dependent, variable slicing level circuit. The slicing level is controlled in response to the analog speed signal from encoder control 20. The output from A/D 24 comprises two digitized signals represent-in North and South polarity information with respect to the detected spaced, magnetic fields 12. A detailed discussion of this circuit will be presented below in connection with FIG. 15.

The digitized magnetic polarity information is applied to a message processer 26 which is discussed in greater detail in connection with FIGS. 16A–16E. A variety of signal processing operations can be performed in the message processer 26. Specifically, a sinusoidal noise elimination circuit is included to detect and discriminate against sinusoidal noise such as that produced by electrical power lines. In addition, a distance "window" is derived from the digital distance signal from encoder control 20. The distance window is described in greater detail below in connection with the coding patterns and array configurations for the spaced magnetic fields 12.

The output from message processer 26 is applied to a communications section 28 which can include a direct keyboard entry of messages for subsequent communication to a central location. The output from the communication section 28 modulates a transmitter 30 which transmits through antenna 32 to a receiving antenna 34 which in turn feeds the transmitted signal to receiver 36. After demodulation in receiver 36, the information signal is inputted to computer 38 for storage and other processing. Suitable output devices 40 are coupled to the computer for information display. In a vehicle monitoring system, the output devices would normally include a CRT map display with appropriate visual indication of vehicle position and status.

Having briefly described the major components of an automatic vehicle monitoring system which incorporates the subject matter of the present invention, we will now discuss in detail the major elements thereof.

SPACED MAGNETIC FIELDS

I. MAGNETIC STUD CODING AND NOISE DISCRIMINATION

Various arrangements are employed for coding the permanent magnets that are used in vehicle location systems or for other purposes wherein it is desired to detect the presence, spacing and polarity of arrays of magnets. Typically, arrays of this type can be used for identifying street locations. Information coded into the arrays becomes useful as a vehicle passes over them and detects the presence of north-south fields. The resulting fields when picked up by a coil or other appropriate means can be readily converted into binary messages.

One way of coding the magnets is to have the binary message unit "1" to represented by magnets installed with a north up orientation and "0" represented by south up (or vice versa). This scheme works to a degree but suffers one fundamental weakness. The problem arises when a group of consecutive 1's or 0's occur. When this happens, the pick up coil, sweeping over the array, fails to develop nearly as much induced current as occurs during a transition between north up and south up magnets. The reason for this observed condition is thought to be that when passing through an essentially steady state field, created by a number of magnets with the same polarity orientation, the coil, after some short distance, cuts as many magnetic field lines going in one direction as the other. The effect is a cancellation of signal that defeats the information transfer process.

This problem can be eliminated by a specific magnet coding and appropriate signal processing circuitry. As mentioned above, it has been observed that the maximum induced signals occur when adjacent magnets are installed with opposite polarities. It is, therefore, most desirable to code the arrays such that each "1" (or "0") is represented by a flux change. A series of "1's" would thus be represented as follows:

| 1 | 1 | 1 | 1 | 1 | 1 | 1 | 1 |
|---|---|---|---|---|---|---|---|
| N<br>S | S<br>N | N<br>S | S<br>N | N<br>S | S<br>N | N<br>S | S<br>N |

A message containing "1's" and "0's" would be coded in this way:

| 1 | 1 | 0 | 0 | 1 | 0 | 1 | 1 |
|---|---|---|---|---|---|---|---|
| N<br>S | S<br>N | | | N<br>S | | S<br>N | N<br>S |

It can be seen that in this case, suceeding "1's" always involve a magnet reversal from the previous "1". Zeros are implied by an absence of magnets. The recognition of "0" data is accomplished by circuitry in the vehicle and a means of knowing the distance traveled by the vehicle. In addition, the message is formated such that the beginning bit is always a "1". With this system, distance traveled information is used to create data strobes at the point where data bits are expected to occur. A sequence of events is therefore established that progresses in the following manner.

As a sensing vehicle moves along it typically passes over a random magnetic source that can appear to be data magnets. Assuming that the system becomes triggered by one of these disturbances, the appropriate control circuitry will begin strobing the pickup coil output at intervals which correspond to the speed-distance relationship of the vehicle and magnet to magnet spacing. If the trigger signal was noise or a valid start magnet, the controller will proceed and make a number of strobes and store the results for subsequent parity checking. If the system was responding to or confused by ambient noise, the parity check will fail and the data will be discarded. Similiarly, if the check was successful the data will be assumed valid.

In implementing this system several other details are important in improving overall reliability. One of these factors involves a specific message leading code. If the magnet codes always begin with a pair of magnets having a north up followed by a south up then the control circuits will only begin looking for further data if this sequence is detected within the proper distance window. Three acceptance criteria are thus required. In addition, once the strobing sequence has begun the circuitry will only accept data occuring at the proper distance and having the correct polarity (always the opposite of the preceeding bit). The combination requirement of meeting these criteria is highly effective in eliminating the confusion of noise with valid data. A further advantage of the arrangement is that is uses fewer magnets than coding employing one magnet for each data bit.

II ARRAY CONFIGURATION AND LAYOUTS FOR COMPLETE COVERAGE AT DIFFERENT SKEW ANGLES

A. Configuration of Magnetic Array

The preceding discussion of "Magnetic Stud Coding and Noise Discrimination", described a method of installing magnets in an AVM system which involved using alternating magnet or orientations to achieve maximum signal output with magnets indicating "ones" and spaces indicating "zeros" in a binary number. The following system utilizes this form of coding but employs a new sequence to provide four basic functions. The four functions are:

1. The array is bi-directional in that it is configured so that the electronic logic can infer the direction in which the vehicle is travelling and process the array information accordingly.
2. The array contains start and stop bits to aid in noise discrimination.
3. The array contains a parity bit to aid in noise discrimination.
4. The array contains blanks to aid in discrimination of sinusoidal noise.

Two sample arrays are presented below:

| Array Code |
|---|
| 1. N $B_1$ S . . N . S N . $B_2$ $B_3$ S (. equal a blank) |
| 2. N $B_4$ S . . N . S . . N $B_5$ S |

In these samples each begins with a North (N) and ends with a South (S). These magnets are always present as start-stop bits and indicate direction of travel since N comes first when traveling in the correct direction and S comes first when traveling in the wrong way.

Blanks $B_1$, $B_3$, $B_4$, $B_5$ provide noise discrimination in two ways. First, they are used to discard sinusoidal noise. Second, as most other noise sources (eg: manhole covers, trolley tracks, steel girders, etc.) have magnetic signatures which start with a swing from one polarity to another. The requirement that a blank follow the first signal will eliminate many non-sinusoidal noise sources. The bit in the position labeled $B_2$ in sample #1 indicates parity. When the last magnet in the array code is a north as in #1, this position is blank. When the last magnet in the array code is a south as in sample #2, parity is indicated by a north in this position. Thus, the system indicates parity while maintaining the alternating magnet orientation. It should be noted that less magnets (2½ on the average) are required than shown in the previous configuration even with the added feature of bi-directionally.

B. Layout & Using Split Coil

As one of the more expensive elements of the AVM system are the magnets installed in the road, it is desirable to limit the number used in each array. In addition, to read arrays at a reasonable angle, the arrays must be as short as possible. This requirement exists because the electronic logic looks at each magnet position through a "window" in distance. The distance traveled is fed to the logic by an encoder driven by the speedometer drive. Each wheel revolution generates a fixed number of pulses. As the angle between the vehicle path and the array increases, the location of the window with respect to the actual magnets shifts toward the beginning of the array. This shift is equal to actual distance [(1-cosine (angle)]

as shown in FIG. 2 Obviously, the last magnet in the array is the first one to be missed as the angle increases, and the shorter the array the larger the angle that can be accommodated.

In practice, with an array of 11 magnet positions on 6 inch centers, it has been found that the system will work up to an angle of between 12° and 13° depending on the accuracy of the magnet installation.

The above description relates to a pickup coil passing over a single array. On wider roads more than one array must be used to assure that the vehicle is picked up. The limitation in this case results from the coil length of five feet which is a little less than the width of the average automobile. The use of multiple arrays while simple in concept is difficult to accomplish while using a minimum of arrays to provide 100% coverage up to the desired skew angle.

One layout for arrays is shown in FIG. 3. This figure shows four arrays placed side-by-side parallel to the road axis. The path covered by a coil attached to a vehicle moving at an angle is also shown. In this case, the coil first senses the magnets in array 3 but then leaves 3 and passes over array 2. In addition at point (A) the coil senses magnets in both 2 and 3. Thus, even though the path of the coil covers both arrays and enough information is presented to the coil to decode the array, cancelling fields could be induced in the coil which would make it read incorrectly. On the other hand if the coil path were parallel to the arrays they could be spaced at approximately the coil length to minimize the number of arrays required.

This layout can be achieved by using a split or dual coil. Two shorter coils, each half the length of the original coil, are placed end to end. The output from each coil is stored in shift registers until the arrays have passed. Finally, the signals are added to create the actual code. Since two independent coils are used no cancellation of signal can occur.

C. Layout With Single Coil

If a single coil is used, the problem described in section B exists. The following description presents the layout which minimizes the number of arrays required to provide complete coverage at angles up to a given angle. In FIG. 4 the following notation is used:

$c$: length of the coil
$l$: length of an array
$d$: lateral distance between arrays
$a$: longitudinal distance between arrays
$\alpha$: angle between vehicle path and array axis The case shown in FIG. 4 is the limiting situation on angular coverage. Arrays 1 and 2 are both covered by the coil but a lateral shift in either direction will result in only one array being sensed. The offset "$a$" is necessary because a clear space must be allowed before array 2 since it is possible that the coil pass over the last magnets in 1 and then continue onto 2. If the magnets and angle occur in the proper relation a false array code could be decoded. If the array code in 1 above is used "$a$" should be:

$$1/\cos\alpha_m - m_s$$

where $m_s$ is the inter-magnet spacing $\alpha m$ is the maximum skew angle

Using the equation given in FIG. 4 to calculate the spacing provided by this configuration for:

$c = 5$ feet
$m_s = 0.5$ feet
$l = 6$ feet
$\alpha = 12°$ gives:

$d/2 = 1.36$ feet

This is far from the spacing of 5 feet which would be required for complete coverage at $\alpha = 0°$.

Figure 5:
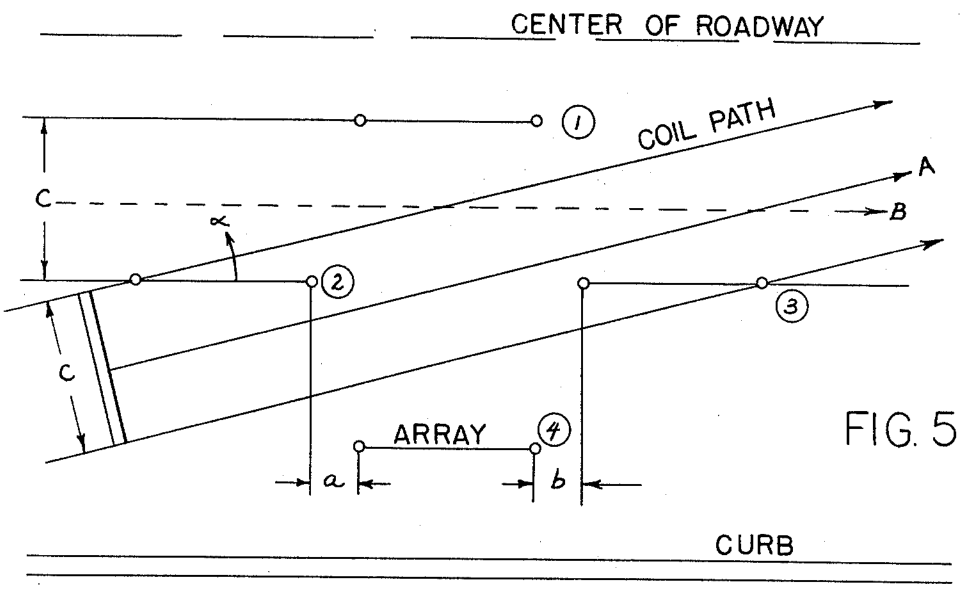
FIG. 5 is a magnetic array diagram illustrating a configuration which minimizes magnet usage.

The array configuration disclosed in FIG. 5 minimizes the number of arrays required to provide angular coverage. In this case, the distance "*d*" between arrays can be equal to the length of the coil "*c*". The limiting case on angular pickup is shown in FIG. 5. The coil must be able to pickup both array 2 and 3 at its maximum angle so that either one or the other will pass under the coil if the vehicle path shifts laterally. The maximum angle an is given by $$m = \sin^{-1} c/3l + a + b$$

"*a*" and "*b*" should be large enough to prevent cancelling of signal by the last magnet in one array and the first in the next array in the case in which the vehicle path is parallel to the array axis and halfway between two arrays (path B in FIG. 5).

In the preferred embodiment, the following values are used:

$l$ = array length = 6 feet
$a = b$ = array spacing - longitudinal = 0.5 feet
$c$ = coil length = 5 feet
$d$ = array spacing - lateral = 5 feet This yields a value for $\alpha$ of:

$$\alpha = \sin^{-1} (5/19)$$

This is the maximum angele that the given coil - array geometry will tolerates.

D. Zone Coding to Reduce Array Length

It is desirable to minimize the number of magnets used as well as the array lengths to keep costs down and to make it possible for the system to operate at reasonable skew angles as described above. One method of accomplishing these goals is to divide the area into zones each having an identifying number and identifying the intersections within each zone with numbers which are repeated from zone to zone.

For example, in a city with 62,500 intersections approximately 250,000 array codes are required. This requires 18 bits to represent the codes in binary. Taking the square root of the number of codes gives 500 codes which requires a 9 bit binary number. Thus, if 500 zones of 500 codes are used, the message in the roadway can be shortened by 9 bits.

However, it is now necessary to mark transitions from one zone to the next. This can be accomplished by either inserting arrays around the boundary of each zone or by storing the pattern in a computer. In the latter case, as long as the same code for an intersection in one zone is not close to the same code in another zone, then no ambiguity exists. the above example, each zone of 500 codes would contain 125 intersections. The configuration with the minimum perimeter would be a square averaging approximately 11.2 roads per side. Each zone then has $$11.2 \text{ roads/side} \times 4 \text{ sides} = 44.8 \text{ roads/zone}$$

on the perimeter and $$44.8 \text{ roads/zone} \times 500 \text{ zones} = 22{,}400 \text{ roads}$$

on the perimeter of all zones. Thus, rather than marking 250,000 roads with an 18 bit code, 22,400 roads are marked with a 9 bit code to mark zones and 250,000 roads within the zones are marked with 9 bit codes to identify roads within zones.

Figure 6:
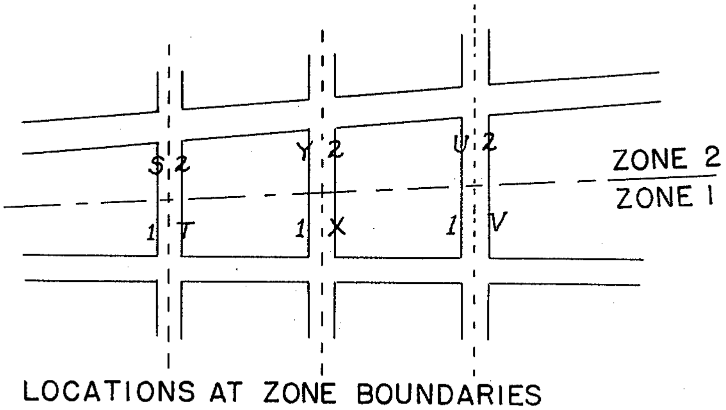
FIG. 6 is a diagram of magnetic array locations at zone boundaries.

It should be noted that this system can provide excellent coverage at zone boundaries. Referring to FIG. 6, the road that passes between zones is marked at the lane exiting from intersection "*x*" in zone 1 and before the next intersection by the new zone code 2. Likewise, the intersection leaving zone 2 is marked with the code "*y*" opposite the zone code and zone code 1 is placed opposite roadway code "*x*". Thus, if bi-directional arrays are used. A vehicle can be detected twice between intersections on either side of the road. If, in addition, the pattern is stored in a computer, the chances of a vehicle passing from one zone to another without being detected are very low.

MAGNETIC FIELD SENSOR

I Split Pickup Coil & Mounting

The following discussion relates to a means for mounting pickup coils used on vehicles to detect magnetic arrays and the coil configuration itself. A coil and its mounting in this kind of service must meet stringent requirements in order to physically survive the demands of heavy duty road service and accurate electrical pickup. In this latter connection, since the magnetic field strength varies inversely as the cube of the distance between the magnets and pickup coil, it is obvious that a coil mounted on the body of a vehicle will be subject to large signal variations with up and down body motion caused by degrees of loading and road variations. In almost any vehicle these motions can and do amount to several inches. This makes mounting of coils directly to the body most unsatisfactory since the nominal magnet to coil spacing is typically on the order of a few inches.

The obvious solution of attaching coils to an axle solves the problem of distance excursions relative to the road surface but does not result in other difficulties. Part of these difficulties are associated with the fact that most vehicles have wheels that are fabricated from steel and steel becomes magnetized and remagnetized in its normal existance. Should this occur, with coils mounted near the axle, the wheel induces a periodic current surge into the coil. Such a noise disturbance is troublesome since it compromises system performance.

Both problems of wheel noise and ground to coil height variations can be largely eliminated in vehicles that have rear leaf springs by mounting the coil at a point approximately half way between the axle and the shackle. This mounting point is nearly ideal since it is largely isolated from body excursions and yet far enough from the wheels to minimize magnetic coupling from that source.

Since the magnetic field drops off sharply as the coil to magnet distance increases, it is desirable from a magnetic standpoint to have the coil as close to the ground as possible consistant with the avoidance of physical damage to the coil. One effective method of accomplishing this is to encase the coil in a strong semiflexible plastic such as, "Lexan" polycarbonate and mount the unit by means of a compliant member to the springs. Such an assembly has been built and tested and found to have exceptional resistance to impact damage and other mechanical effects associated with close running to the street. It has also been found that the compliant mounting should have a high damping factor. Material such as spring steel, while excellent in strength and flexibility is poor as a damping agent and, therefore, allows the coil to oscillate freely. Such mechanical oscillations in the earth's magnetic field are sufficient to produce electrical noise detrimental to the systems performance. A suitable material for mounting the coil to avoid this problem is polyurethene or high durometer rubber.

It has been observed that certain anomolies in the earth's magnetic field cause difficulties in picking up the array information correctly. Some of these anomolies are dimensionally large in comparison to the field produced by the array magnets. This fact can be used to discriminate between the wanted and unwanted effects. One way of doing this is to use a multipart coil instead of a single unit.

Referring to FIG. 7, such a device can be implemented as follows: Two non-overlapping coils 42 and 44 can be arranged such that their total span covers the desired physical distance across the vehicle. The outputs of these coils are electrically summed together such that their summing polarities are opposite. This summing is achieved by summing resistors R1 and R2, op. amp. 46 and feedback resistor R3. Thus, when large common mode signals are present, both coils will pickup fields of approximately the same amplitude, but since they are subtracted from one another, the effect will be a cancellation. However, in cases where the signal source is small, as with an array magnet, then one of the two coils will have an unbalanced signal that can be processed with conventional techniques.

One situation that can arise with this method is unwanted cancellation when both coils pickup equally a magnet passing directly between the two coils. This difficulty can be eliminated by the addition of a small third coil 48 spanning the two primary coils 42 and 44 as shown in FIG. 8. Its output is summed with the difference signal of the two main coils to produce a composite output by means of summing resistors R4 and R5, op. amp. 50 and feedback resistor R6. Common mode effects will be sensed by the small unit. However, since its noise output is a function of its physical size only a relatively small disturbing effect will be caused by its presence.

II Shielded Coil Configuration

Figure 9:
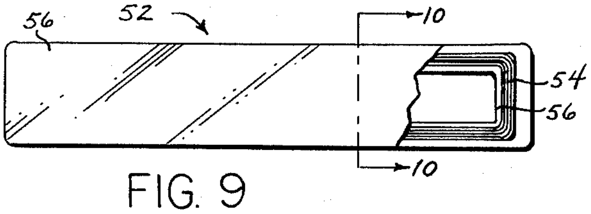
FIG. 9 is a front view partially broken away of a vehicle pickup coil.
Figure 10:
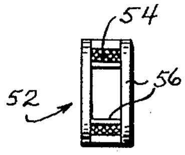
FIG. 10 is a cross-sectioned view of the pickup coil of FIG. 9 taken along lines 10—10.

In a preferred AVM system the pickup coil 52 is an important part of the system. This coil, suspended under the vehicle, actually detects the magnets embedded in the pavement. It typically consists of 300 turns of #30 copper wire 54 on a five foot bobbin 56 separated by a distance of 3½ inch. FIGS. 9 and 10 show this configuration as used in early tests. The coil was suspended vertically from the rear springs 4½ inch above the pavement. When this type of coil is used a current is induced in the lower ½ in one direction and in the upper ½ in the opposing direction. The magnitude of the induced current depends on the distance from the magnet. Thus, if the 3½ inch dimension were reduced to zero the induced currents would cancel each other. The larger the separation between the top and bottom halves of the coil the less cancelling occurs. However, because of space constraints in actually mounting a coil under a vehicle it is desirable to have this dimension as small as possible. The 3½ inch separation is a compromise between these two requirements.

Figure 11:
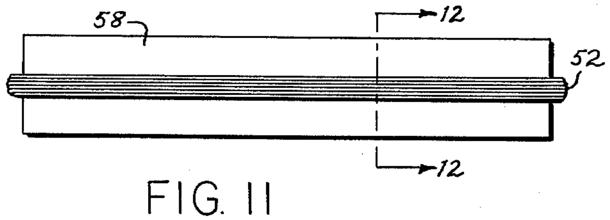
FIG. 11 is a plan view of a partially shielded pickup coil.
Figure 12:
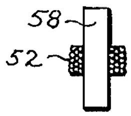
FIG. 12 is a view in cross-section taken along lines 12—12 in FIG. 11 showing the partially shielded pickup coil.

An improved coil configuration which makes it possible to reduce this dimension to less than ½ inch while at the same time increasing the coils sensitivity is shown in FIGS. 11 and 12. In this case, the coil 52 is wrapped around a thin core 58 of steel, iron or other material with a high magnetic permeability. Tests have shown that the critical dimension in this case is the distance × in FIG. 11. When a value of × equals to 2 inch is used the coil has a sensitivity approximately equal to the configuration shown in FIGS. 9 and 10. A value larger than 2 inch gives a higher sensitivity. For easy installation, a valve between 4 inch and 6 inch is optimal with a core thickness of approximately 1/16 inch.

Other configurations which accomplish the same goal involve shielding the upper half of the coil from the magnetic field by wrapping it with Mu-metal tape, winding it through a tube, or winding the coil on a piece of steel channel. These all produce the desired effect but not with the case of the preferred embodiment.

In the broadest sense the improvement covers the use of a magnetically permeable material to shield the upper half of the pickup coil from the lower half. In a more restricted sense this technique can be limited to vehicle mounted coils for detecting magnets embedded in a surface as part of a system which permits transfer of binary coded information from the surface to the moving vehicle.

SPEED DEPENDENT SIGNAL PROCESSING FOR MAGNETIC FIELD DETECTION

The automatic vehicle location system utilizes coded magnetic arrays that are sensed by vehicles passing over them. In attempting to correctly detect and identify the information contained in these arrays, problems of varying vehicle speeds arise. This is apparent when it is realized that the induced signal strength detected by the vehicle pickup coil is directly proportional to speed. Compensation to effectively counteract this widely changing signal level can be accomplished in either of two ways.

Figure 13:
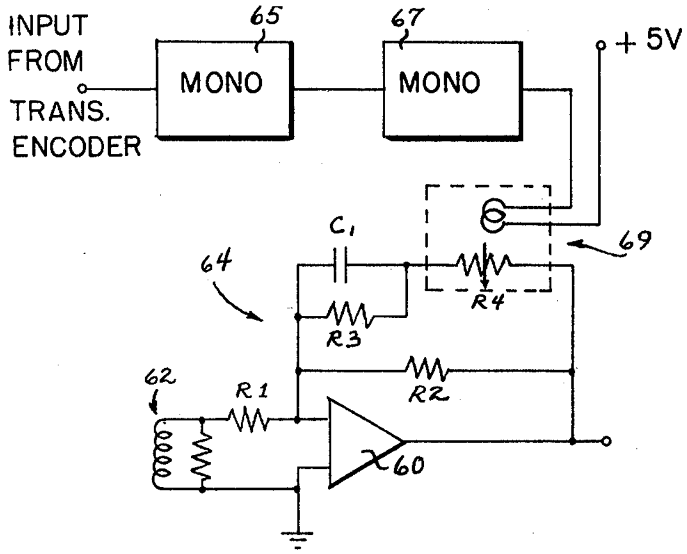
FIG. 13 is a partial schematic and block diagram of a speed dependent signal processor utilizing an amplifier having a speed dependent gain.

The first technique to do this which is shown in FIG. 13 uses automatic gain control around an amplifier driven from a pickup coil. This is implemented by a multi-path feedback loop 64 and the other circuitry shown in FIG. 13. In this circuit, vehicle velocity information coming from a transmission shaft encoder (encoder 18, FIG. 1) as a digital pulse train is first processed by monostables 65 & 67. These produce a pulse train of constant width at a rate varying directly with vehicle speed. Their output feeds a "Raysistor" type optical isolator 69. This four terminal device has the characteristics of varying its output resistance as power supplied to the input is varied. The isolator output is shown in FIG. 13 as $R_4$.

$R_4$ is one element of the feedback network 64 around the pickup coil amplifier 60. $R_2$ and $R_3$ interact with the amplifier and $R_4$ in the following way; at low vehicle speeds, average energy reaching the input of the isolator is low due to the relatively frequent arrival of pulses. Under these conditions the resistance of $R_4$ is close to infinity ($>10^7\Omega$) making the feedback loop largely a function of $R_2$. This resistor is sized to produce some maximum gain for very low vehicle speeds. As vehicle speed increases, increasing energy goes into the isolator and its output resistance decreases. When some midrange vehicle speed is reached, $R_4$ becomes essentially a short circuit making $R_3$ and $C_1$ the primary feedback elements. Their lower impedance decreases the loop gain to compensate for the increase in signal level that occurs with increasing vehicle speed. As the vehicle speed rises beyond the point where $R_4$ has any further effect, $C_1$ continues to lower the gain. This occurs because the signal waveshape has a fundamental frequency component directly related to vehicle speed. Higher signal frequencies are, therefore, generated at higher speeds along with greater output amplitude which is in turn reduced by the increasingly lowered impedance of $C_1$. By these means output amplitude can be made essentially constant with widely varying vehicle velocities.

SPEED DEPENDENT SIGNAL FILTER

Figure 14:
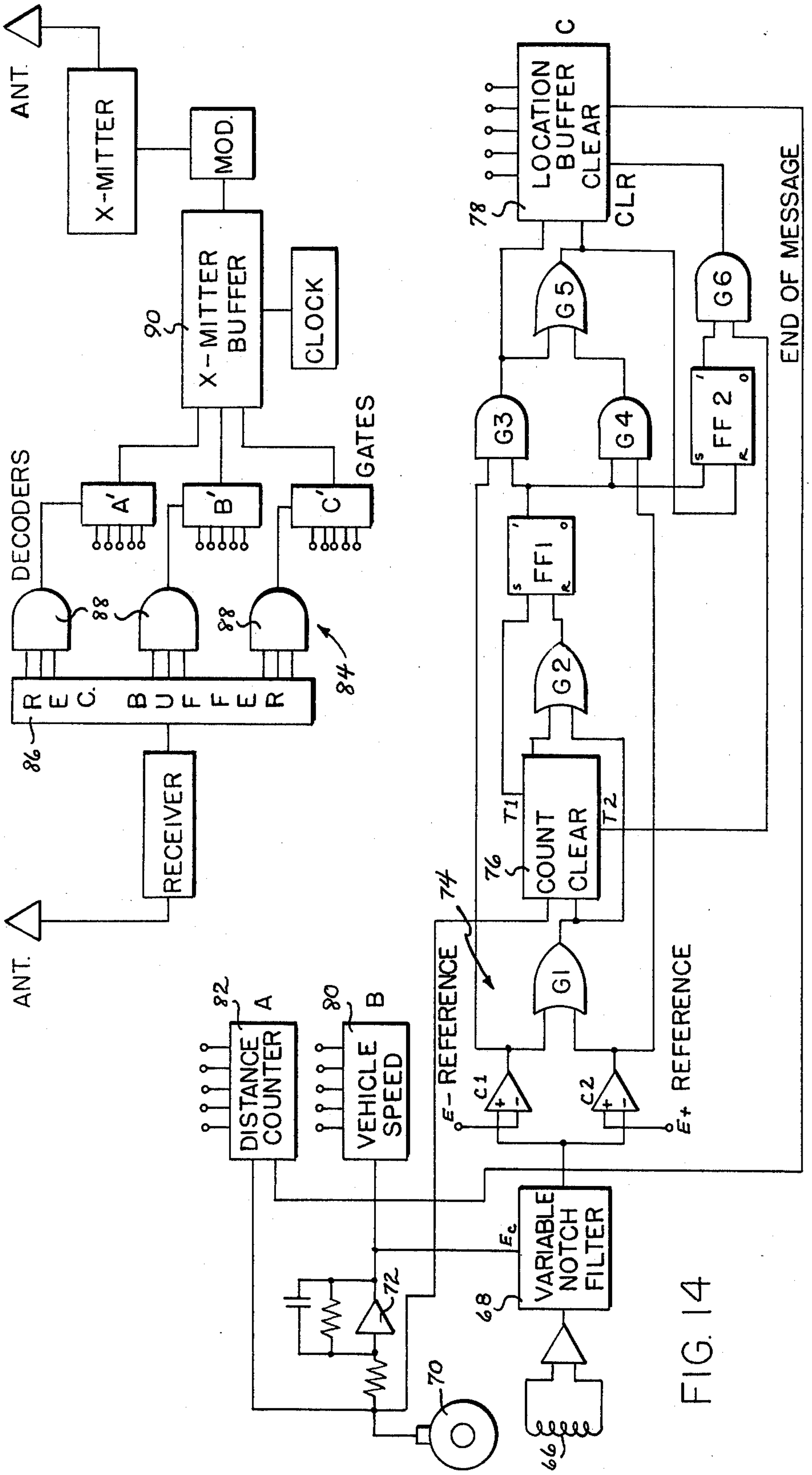
FIG. 14 is a partial schematic and block diagram of a speed dependent variable pass band filter.

It has been found in the practical implementation of the vehicle location system that various AC fields (60 Hz) or magnetic materials (manhole covers, etc.) present in streets can cause disturbances either through distortion of the earth's magnetic field or creation of a separate unwanted field. A means for minimizing the effects of these spurious or anomalous fields is illustrated in FIG. 14.

The primary receptor of location information in this system is a pick-up coil 66 mounted on the vehicle. The output from this coil is first amplified and then fed into a bandpass filter 68 that allows only information occurring at a particular, selected frequency to pass. The filter is a voltage tuned unit that responds to control voltage levels such that its bandpass region occurs at a frequency determined by the D.C. voltage level applied to its control terminals. The filter rejects all electrical signals applied to its terminals except those occurring at some particular, selectable frequency. As can be seen in the Figure, the control voltage applied to the filter is synthesized by means of an electrical pulse generator 70 attached to the speedometer drive, and an analog integrator 72. Together, these elements produce a control voltage whose magnetode is directly proportional to vehicle speed. Assuming that the signal magnets are spaced along a roadway at equal distances, then it can be understood that there will be a definite fixed relationship between vehicle speed and the frequency at which the information pulses occur. This frequency, at any vehicle speed, is the only one allowed to pass.

Analog signals from the output of the voltage variable filter next go to a digitizer 74 and circuitry for further reducing the effects of unwanted signals. Digitizing is accomplished by means of dual comparators C1 and C2 that are responsive to either positive and negative going pulses. A counter 76 and its associated logic constitutes the second noise elimination section of this circuit. The counter 75 continuously receives incrementing pulses from the speedometer encoder 70 at any time that the vehicle is moving. The relationship between the distance traveled by the vehicle and the counter capacity is such that the counter is almost filled (95% typ.) when the vehicle has covered a distance equal to the spacings between data magnets.

A tap, T1 is also provided on the counter to indicate when it is approximately 90% filled. The objective of setting up these relationships is to create a "window of distance" which will allow data to be received and processed only over distances corresponding to the mean distances between magnets plus or minus 5%. At any other point extraneous noise will be absolutely inhibited.

This action is accomplished as shown by counter 76, FF, and gates G1, G2, G3, G4 and G5. These elements operate in the following manner. A digitized pulse coming from either comparator C1 and C2 are ORed together in G1 and used to reset the counter whenever a magnet is encountered. This output also resets FF1 through G2 inhibiting transfer of data into a location buffer 78. At this point the counter 76 is cleared and, assuming the vehicle is moving, pulses from the speedometer encorder start incrementing the counter. After 90% of the distance has been covered to the next magnet, a pulse appears at Tap T on the counter setting FF1. When this occurs, gates G3 and G4 are enabled allowing any data coming from the comparator outputs to pass into the location buffer 78. At the same time if data was received, counter is again cleared and made ready for the next sequence. If no data appeared between the 90% and full count capacity of the counter, then the counter in effect clears itself and resets FF1 as it passed through full to zero.

Assuming that a data magnet was present during the second cycle period just described and that a data pulse did occur, it can be seen that the pulse would arrive at the location buffer 78 by one of two possible routes. If the leading edge of the induced pick-up coil voltage was positive, comparator C1 would have fired causing a pulse to pass through G3 and into the data input of the location buffer as a one in location one. On the other hand, if the received data was negative going then C2 would be activated causing the data to pass through G4 and G5 to the incrementing input of buffer 78. The result of this would be a zero in location one. By this means, the location buffer can be filled as successive data bits are received.

The logical operations of FF2 and G6 act to clear the location buffer if an incomplete or spurious message is received. This section operates by essentially asking if data was present during a "window" period. If the answer was yes, FF2 is reset inhibiting G6. If the answer was no then G6 would be enabled allowing a pulse from the next cycle to pass from T2 on counter D through G6 and G7 to the reset on buffer 78.

This location system is also able to provide other information concerning the vehicle that may be useful in monitoring its activity. One example is vehicle speed and another is distance covered since the last exact position received. Speed monitoring is provided by the integrator 72 and an Analog-to-digital converter 80 connected to the speedometer encoder 70. These elements yield a continuous binary number present at the A/D output that can be sampled at any time to obtain a current vehicle speed. Distance from the last magnet array is measured by a counter 82 connected directly to the speedometer encoder. The distance counter continuously picks up pulses corresponding to distances and accumulates them. When a new end of message signal occurs in the location buffer, the distance counter is reset.

Other data associated with the vehicle itself or messages entered by the operator are also able to be used with this system. For example gasoline tank levels, coolant temperature, oil pressure, etc. can readily be coverted to a binary format and handled in a manner similar to the location information. Use of a keyboard or other input devices together with a register and other conventional switching can allow transmission of any desired supplimentary or unrelated data. The receiver chain is also useable as a means for dealing with other remotely generated data. Examples would be displays of various kinds using a CRT, lights, voice, printers, etc. Also direct vehicle commands such as stopping the engine, turning on an alarm.

A final part of this invention is a means for transmitting the various data back to some remote point. This is accomplished by means of a transceiver 84 that is able to respond to polling signals and selectively or sequentially transmit the data stored in various storage registers. Implementation is carried out with a data buffer 86 connected to the received output and appropriate decoders 88. When a request to transmit is received, one of the decoder outputs goes high enabling the contents from one of the buffers A, B, C, etc. to be transferred to the transmit buffer 90 through a gate A′, B′, C′ etc. These data are clocked out through the transmitting modulator, and transmitter to the antenna.

A/D - VARIABLE SLICING LEVEL

An alternate means for compensating vehicle speed changes is shown in FIG. #15. In this arrangement monostables 92 and 94 form a pulse train having a duty cycle proportional to vehicle speed. This output feeds dual detectors 96 and 98 that produce + and - DC outputs proportional to the input duty cycle which as stated above is also directly proportional to vehicle speed. These + and - DC voltages are applied to the reference sides of comparators 100 and 102. The comparators compare the unknown signal levels coming from amplifier 104 with the variable levels generated by the demodulators 96 and 98. The result of this configuration is a circuit that varies the slicing level on the reference sides of the comparators as a function of vehicle speed and thereby compensates for decreasing signal voltage as the vehicle speed decreases. The outputs from comparators 100 and 102 represents the North-South magnetic field in digitized form.

When operating conditions require it, this variable slicing level circuitry can be combined with the automatic gain control shown in FIG. 13. Furthermore, maximum level rejection can be provided in the slicing level circuitry to produce a usable band of signals in which the voltage could be made speed dependent. Signal width slicing in addition to signal height slicing, is an additional refinement for noise discrimination.

The use of signal width slicing is particularly helpful in discriminating against the magnetic signal produced by manhole covers. The manhole cover signals are significantly wider than the valid magnet signals. Accordingly, by providing a maximum signal width cutoff which is less than the width of the manhole cover signals, such signals can be rejected.

SINUSOIDAL NOISE ELIMINATION FOR MAGNETIC FIELDS

The automatic vehicle monitoring system uses coded magnetic arrays that are sensed by vehicles passing over them with a magnetic field detector such as a pickup coil. Due to the presence of buried power transmission lines in roadways, the detection and elimination of sinusoidal noise received by the sensor from power lines as well as other sources is very desirable.

Figure 16A:
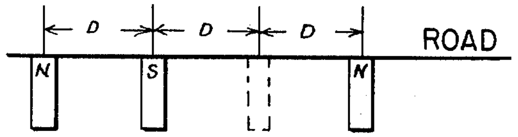
FIG. 16A is a diagram of a magnetic array configuration which is employed to discriminate against sinusoidal noise.
Figure 16B:
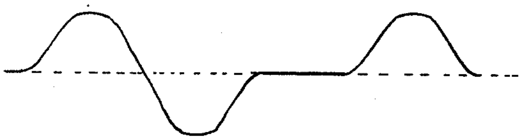
FIG. 16B is a waveform of the magnetic signal produced by the array configuration of FIG. 16A.
Figure 16C:
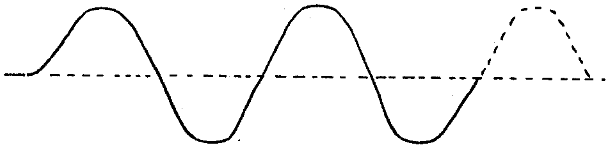
FIG. 16C is a waveform of a sinusoidal noise display with respect to the magnetic array configuration of FIG. 16A.
Figure 16D:
FIG. 16D is a digital signal representation of the FIG. 16B magnetic signal waveform; and, FIG. 16E is a block diagram of a circuit for detecting sinusoidal noise.
Figure 16E:
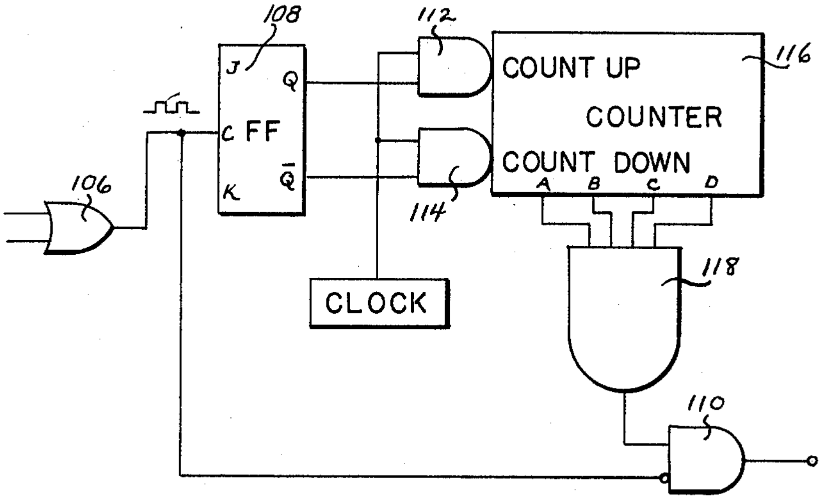

It is possible to discriminate the arrays from most forms of sinusoidal noise of any frequency by means of a specific magnetic array configuration which is used in conjunction with the circuit shown in FIG. 16E. The magnets are placed in the roadway in a sequence, such as that shown in FIG. 16A, which includes a magnet position which is left blank. The blank position is illustrated in FIG. 16A by the dotted lines.

FIG. 16B depicts the correct magnet signal for the array shown in FIG. 16A. Note that the signal level is zero for the blank magnet position. FIG. 16C illustrates the waveform for a sinusoidal noise in which the signal is present at the blank magnet position FIG. 16D shows a good digital signal developed from the magnet signal waveform of FIG. 16B.

The circuit of FIG. 16E is employed to discriminate against sinusoidal noise by looking for the presence of a signal at the blank magnet position. Referring back to FIG. 15, the digitized outputs from comparators 100 and 102 are ORed to ORgate 106. The output from gate 106 is applied to FF108 and AND 110.

The Q and $\overline{Q}$ outputs of the flip flop are inputted to clocked AND gates 112 and 114, respectively, which in turn feed an UP/DOWN counter 116. The counting stages are inputted to AND gate 118 which supplies the second input to the previously mentioned AND gate 110. The output of AND gate 110 represents a detected sinusoidal noise. This output is employed to reset the entire system so that the detected noise will not be processed and identified as a valid magnet array.

Having described a preferred embodiment of our invention, it will now be apparent that numerous modifications can be made therein without departing from the scope of the invention as defined in the following claims.

What we claim and desire to secure by Letters Patent of the United States is:

1. A signal processing system for processing signals derived from the presence of a magnetic field said signal processing system comprising:

(1) means for producing an electrical signal in response to the presence of a magnetic field;

(2) variable gain amplifier means for amplifying the electrical signals produced by said signal producing means;

(3) means responsive to the rate of relative movement between said electrical signal producing means and a plurality of spaced, magnetic fields for varying the gain of said amplifier means as a function of said rate of relative movement whereby the amplitude of the signal output is substantially constant;

(4) variable threshold electrical signal processing means for processing only electrical signals from the output of said amplifier means which exceed a variable threshold; and, (5) means responsive to the rate of relative movement between said electrical signal producing means and a plurality of spaced, magnetic fields for varying the threshold of said variable threshold electrical signal processing means as a function of said rate of relative movement.

2. A signal processing system for processing signals derived from the presence of a magnetic field said signal processing system comprising:

(1) means for producing an electrical signal in response to the presence of a magnetic field;

(2) variable gain amplifier means for amplifying the electrical signals produced by said signal producing means;

(3) means responsive to the rate of relative movement between said electrical signal producing means and a plurality of spaced, magnetic fields for varying the gain of said amplifier means as a function of said rate of relative movement whereby the amplitude of the signal output is substantially constant;

(4) variable pass band, electrical signal filtering means for filtering the output signals from said variable gain amplifier means; and, (5) means responsive to the rate of relative movement between said electrical signal producing means and a plurality of spaced, magnetic fields for varying the pass band of said electrical signal filter means as a function of said rate of relative movement.

3. A signal processing system for processing signals derived from the presence of a magnetic field, said signal processing system comprising:

(1) means for producing an electrical signal in response to the presence of a agnetic field;

(2) variable pass band, electrical signal filtering means for filtering the electrical signals produced by said signal producing means;

(3) means responsive to the rate of relative movement between said electrical signal producing means and a plurality of spaced, magnetic fields for varying the pass band of said electrical signal filter means as a function of said rate of relative movement;

(4) variable threshold electrical signal processing means for processing only the filtered output signals from said signal filtering means which exceed a variable threshold; and, (5) means responsive to the rate of relative movement between said electrical signal producing means and a plurality of spaced, magnetic fields for varying the threshold of said variable threshold electrical signal processing means as a function of said rate of relative movement.

4. A signal processing system for processing signals derived from the presence of a magnetic field, said signal processing system comprising:

(1) means for producing an electrical signal in response to the presence of a magnetic field (2) variable pass band, electrical signal filter means for filtering the electrical signals produced by said signal producing means; and, (3) means responsive to the rate of relative movement between said electrical signal producing means and a plurality of spaced, magnetic fields for varying the pass band of said electrical signal filter means as a function of said rate of relative movement.

5. A signal processing system for processing electrical signals derived from the presence of a magnetic field, said signal processing system comprising:

(1) means for producing an electrical signal in response to the presence of a magnetic field; and, (2) means responsive to the amount of relative movement between said electrical signal producing means and a plurality of spaced, magnetic fields for processing the electrical signals from said signal producing means only when the amount of relative movement is within a predetermined range of distances which includes the distance between two preselected magnetic fields.

6. A signal processing system for processing electrical signals derived from the presence of a magnetic field, said signal processing system comprising:

(1) means for producing an electrical signal in response to the presence of a magnetic field;

(2) variable pass band, electrical signal filter means for filtering the electrical signals produced by said signal producing means;

(3) means responsive to the rate of relative movement between said electrical signal producing means and a plurality of spaced, magnetic fields for varying the pass band of said electrical signal filter means as a function of said rate of relative movement; and, (4) means responsive to the amount of relative movement between said electrical signal producing means and a plurality of spaced, magnetic fields for processing the electrical signals from said filter means only when the amount of relative movement is within a predetermined range of distances which includes the distance between two preselected magnetic fields.

* * * * *